United States Patent
Vinet et al.

(10) Patent No.: US 9,425,051 B2
(45) Date of Patent: Aug. 23, 2016

(54) METHOD FOR PRODUCING A SILICON-GERMANIUM FILM WITH VARIABLE GERMANIUM CONTENT

(71) Applicants: COMMISSARIAT A L'ENERGIE ATOMIQUE ET AUX ENERGIES ALTERNATIVES, Paris (FR); STMICROELECTRONICS SA, Montrouge (FR)

(72) Inventors: Maud Vinet, Grenoble (FR); Laurent Grenouillet, Grenoble (FR); Yves Morand, Grenoble (FR)

(73) Assignees: COMMISSARIAT À L'ENERGIE ATOMIQUE ET AUX ENERGIES ALTERNATIVES, Paris (FR); STMICROELECTRONICS SA, Montrouge (FR)

( * ) Notice: Subject to any disclaimer, the term of this patent is extended or adjusted under 35 U.S.C. 154(b) by 0 days.

(21) Appl. No.: 14/270,603

(22) Filed: May 6, 2014

(65) Prior Publication Data
US 2014/0349460 A1 Nov. 27, 2014

(30) Foreign Application Priority Data
May 6, 2013 (FR) ..................... 13 01049

(51) Int. Cl.
*H01L 21/84* (2006.01)
*H01L 21/225* (2006.01)
(Continued)

(52) U.S. Cl.
CPC ......... *H01L 21/225* (2013.01); *H01L 21/2225* (2013.01); *H01L 21/823821* (2013.01);
(Continued)

(58) Field of Classification Search
CPC ............... H01L 29/66477; H01L 29/66575; H01L 29/66628; H01L 29/7848; H01L 21/22; H01L 21/225; H01L 21/845
USPC ............... 257/E21.135, E21.144, E21.409, 257/E21.43, E21.431, E21.433, E29.085
See application file for complete search history.

(56) References Cited

U.S. PATENT DOCUMENTS 5,336,903 A * 8/1994 Ozturk et al. ............... 257/19
6,830,962 B1 * 12/2004 Guarini et al. ............. 438/149
(Continued)

FOREIGN PATENT DOCUMENTS

FR 2 877 141 A1 4/2006
WO WO 2011/054776 A1 5/2011

OTHER PUBLICATIONS

Tech Design Forum, "What is a finFET and why is it useful" Jun. 20, 2013.*
(Continued)

*Primary Examiner* — Mohammad Islam
*Assistant Examiner* — Christina Sylvia
(74) *Attorney, Agent, or Firm* — Oliff PLC (57) ABSTRACT

The substrate is provided with a first semiconducting area partially covered by a first masking pattern to define a protected surface and an open surface. A continuous layer of silicon-germanium is deposited in non-selective manner on the first semiconducting area and on the first gate pattern. The continuous silicon-germanium layer forms an interface with the first semiconducting area. A diffusion/condensation annealing is performed to make the germanium atoms diffuse from the silicon-germanium layer to the open surface of the first semiconducting area. The masking pattern is a gate stack of the transistor or is used to define the shape of the gate stack in an electrically insulating layer so as to form a self-aligned gate stack with the source and drain areas.

15 Claims, 5 Drawing Sheets

(51) Int. Cl.
*H01L 21/22* (2006.01)
*H01L 29/66* (2006.01)
*H01L 29/78* (2006.01)
*H01L 29/786* (2006.01)
*H01L 21/8238* (2006.01)

(52) U.S. Cl.
CPC ............ *H01L21/84* (2013.01); *H01L 21/845* (2013.01); *H01L 29/66742* (2013.01); *H01L 29/66795* (2013.01); *H01L 29/7848* (2013.01); *H01L 29/78618* (2013.01); *H01L 29/785* (2013.01)

(56) References Cited

U.S. PATENT DOCUMENTS

| | | | |
|---|---|---|---|
| 7,132,322 B1* | 11/2006 | Greene et al. | 438/199 |
| 8,901,664 B2* | 12/2014 | Basker et al. | 257/369 |
| 2006/0088988 A1 | 4/2006 | Halimaoui et al. | |
| 2007/0257315 A1* | 11/2007 | Bedell et al. | 257/350 |
| 2008/0042209 A1* | 2/2008 | Tan et al. | 257/369 |
| 2009/0261381 A1 | 10/2009 | Kim et al. | |
| 2010/0297818 A1* | 11/2010 | Han et al. | 438/230 |
| 2011/0024804 A1* | 2/2011 | Chang et al. | 257/288 |
| 2012/0286329 A1* | 11/2012 | Cheng et al. | 257/190 |
| 2014/0131735 A1* | 5/2014 | Hoentschel | H01L 21/84 257/77 |

OTHER PUBLICATIONS

Wo 2000003061.*
Ang et al., "Strained Thin-Body p-MOSFET With Condensed Silicon-Germanium Source/Drain for Enhanced Drive Current Performance," *IEEE Electron Device Letters*, Jun. 2007, vol. 28, No. 6, pp. 509-512.

* cited by examiner

METHOD FOR PRODUCING A SILICON-GERMANIUM FILM WITH VARIABLE GERMANIUM CONTENT

BACKGROUND OF THE INVENTION

The invention relates to a method for producing a silicon-germanium film for a field effect device.

STATE OF THE ART

The continuous increase of the performances of integrated circuits, for example in terms of consumption and/or operating frequency, is ineluctably resulting in a constant reduction of the size of its components. In order to produce devices with ever-increasing performances, new architectures and/or new materials have been integrated in transistors.

The current microelectronics technology, based on silicon, is reaching the limits of the possibilities offered by this material. The increasing requirements for electronic devices with even better performances, that are faster and less power-consuming, have led to new solutions being studied.

In comparison with silicon, pure germanium presents a mobility that is twice as high for the electrons and four times higher for the holes. The drawback of germanium transistors is the cost of the substrate which is about 10 times higher than that of a bulk silicon substrate. Furthermore, it is very difficult to form channels made from pure germanium by epitaxy of high-quality germanium on a silicon substrate. One solution is to form a channel made from silicon-germanium alloy in order to increase the performances of the transistor without encountering the drawbacks of pure germanium.

A particular application relates to p-type field effect transistors (pMOSFET: metal-oxide-semiconductor field effect transistor). The article "Selectively-formed high mobility SiGe—On-Insulator pMOSFETs with Ge-rich strained surface channels using local condensation technique" by T. Tezuka et al. (2004 IEEE Symposium on VLSI Technology Digest of technical papers) in particular describes production of a pMOSFET with a particularly perceptible improvement of the performances for charge carrier depleted transistors (FD pMOSFET) made from germanium.

However, this technique is particularly difficult to implement for substrates of semiconductor on insulator type with thin films. The temperature applied to obtain diffusion of the germanium atoms in the semiconductor film also results in a modification of the configuration of the substrate. The modifications of the substrate are all the greater the smaller the thicknesses.

The document US 2008/0042209 describes a method for performing fabrication of a P-type transistor by condensation of germanium. A gate electrode is formed on a P-type semiconducting area. Lateral spacers are formed to cover the edges of the gate electrode, the top of the electrode being covered by a layer of silicon nitride.

A silicon-germanium film is selectively deposited on the P-type semiconducting area. This silicon-germanium film is oxidized to obtain condensation of the germanium atoms into the source/drain areas defined in the P-type semiconducting area.

This fabrication method theoretically enables a transistor to be formed having source/drain areas that are germanium-enriched in comparison with the conduction channel.

However, industrial integration of this fabrication method results in the formation of devices that do not present good performances and with a very great disparity in the electrical performances.

An alternative way is proposed in the document US2009/0261381 which describes deposition of a non-selective film of SiGe on a silicon pattern which is partially covered by a mask. Condensation annealing is performed so as to form a germanium-enriched area and a depleted area. The silicon oxide formed by the condensation annealing and mask are eliminated to enable production of a transistor by means of conventional techniques.

Industrial integration of this fabrication method here again results in the formation of devices that do not present good performances and with a very great disparity in the electrical performances.

OBJECT OF THE INVENTION

The object of the invention is to produce a field effect device provided with silicon-germanium areas which is easier to implement.

The method according to the invention is characterized in that it successively comprises:
  providing a substrate provided with a first semiconducting area partially covered by a first masking pattern to define a protected surface and an open surface,
  depositing a continuous silicon-germanium layer on the first semiconducting area and on the first masking pattern, in non-selective manner, so as to form an interface between the continuous silicon-germanium layer and the first semiconducting area,
  applying a diffusion annealing configured to make the germanium atoms diffuse from the silicon-germanium layer to the open surface of the first semiconducting area,
  depositing an electrically insulating layer so as to cover the masking pattern and the source and drain areas,
a method wherein, after application of the diffusion annealing:
  the masking pattern is a gate stack of the transistor or is used to define the shape of the gate stack in the electrically insulating layer so as to form a gate stack which is self-aligned with the source and drain areas.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PREFERRED EMBODIMENTS OF THE INVENTION

Figure 1:
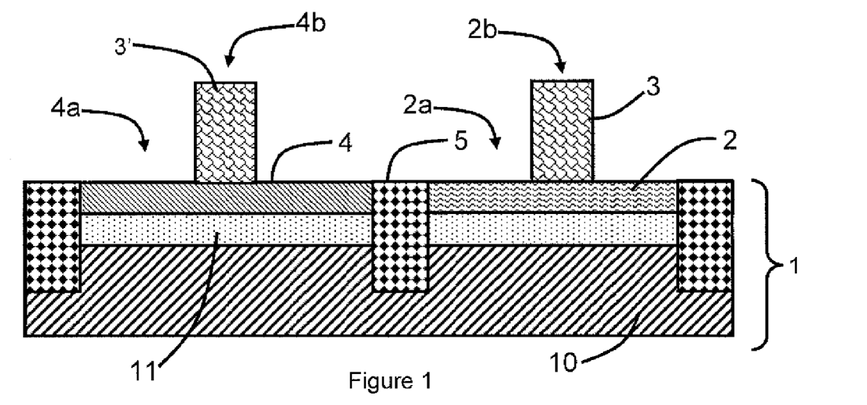
FIGS. 1, 2, 3, 5, 6 and 11 represent, in schematic manner, in cross-sectional view, steps of a method for producing germanium-enriched areas.

As illustrated in FIG. 1, substrate 1 comprises at least a first semiconducting area 2 covered by a first masking pattern 3 which is advantageously a gate pattern. Area 2 is single-crystal and is formed by a material or a material alloy of valence IV. Area 2 can for example be made from doped or intrinsic silicon or silicon-germanium alloy. It is also possible to have a stack of several semiconducting layers to form area 2.

As an alternative embodiment that is not represented, several masking patterns 3 can partially cover first semiconducting area 2. Masking pattern or patterns 3 define open surfaces 2a and complementary protected surfaces 2b in semiconducting area 2.

In an advantageous embodiment illustrated in FIG. 1, substrate 1 comprises first and second areas made from semiconductor material 2 and 4 each covered by a masking pattern 3 which can be a gate pattern defining a gate electrode or a future gate electrode. The two semiconducting areas 2 and 4 can be separated by an insulation pattern 5 which is electrically insulating. In advantageous manner, first semiconducting area 2 is made from a first semiconductor material and second semiconducting area 4 is made from a second semiconductor material which can be different from or identical to the first semiconductor material.

In a particular embodiment, masking pattern 3 can define a gate electrode or a gate stack. In this case, it comprises an electrically insulating layer which separates an electrically conducting layer and the associated semiconducting area.

In an alternative embodiment, masking pattern 3 is a gate pattern that can define a future gate electrode or the future gate stack. Pattern 3 is a false gate electrode which will be eliminated during the method. In this case, the gate pattern can be formed by one or more electrically conducting or insulating layers. In advantageous manner, the false gate electrode is made from materials which can be selectively eliminated with respect to the associated semiconducting area.

According to the embodiments, the two semiconducting areas 2 and 4 can be covered by gate electrodes or false gate electrodes. It can further be envisaged to have a gate electrode on one semiconducting area and a false gate electrode on the other semiconducting area. Protected surfaces 2b and 4b advantageously correspond to the conduction channels and open surfaces 2a and 4a advantageously correspond to the source/drain electrodes.

Figure 2:
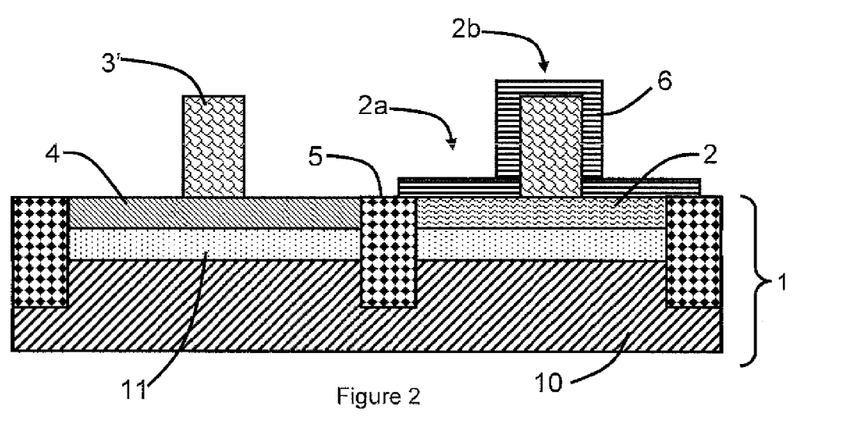

As illustrated in FIG. 2, a silicon-germanium layer 6 is deposited in non-selective manner on first semiconducting area 2. Silicon-germanium layer 6 can be deposited intrinsic or doped. In the illustrated example, silicon-germanium layer 6 is deposited full wafer and then selectively eliminated in the unrequired areas. In advantageous manner, silicon-germanium layer 6 is deposited intrinsic, i.e. not doped so as to prevent diffusion of the dopant atoms when a subsequent diffusion annealing is performed.

Silicon-germanium layer 6 has an interface with surface 2a of first semi-conducting area 2 which is not covered by masking pattern 3.

Figure 3:
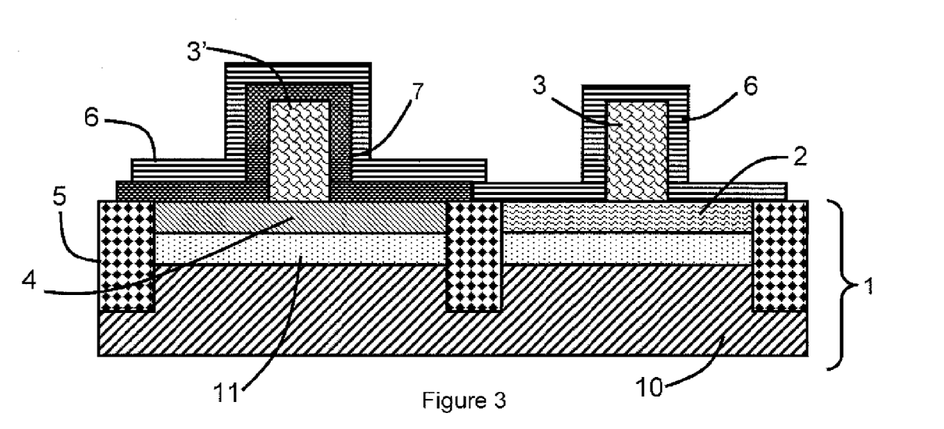

As illustrated in FIG. 3, in the case where two semiconducting areas 2 and 4 exist, area 4 and its masking gate pattern 3 are advantageously covered by a protection layer 7. Protection layer 7 can be made from any suitable electrically conducting or insulating material. In a particular embodiment, protection layer 7 is made from silicon oxide or from silicon nitride. Protection layer 7 is configured to restrain diffusion of the germanium atoms between silicon-germanium layer 6 and second semiconducting area 4. This embodiment enables the two semiconducting areas to be dissociated by applying different technological steps. Silicon-germanium layer 6 can be deposited by any suitable technique.

Protection layer 7 is arranged on semiconducting area 4. Protection layer 7 can be made from any suitable material. Protection layer 7 is advantageously formed by an electrically insulating material, for example a silicon oxide, a silicon nitride, a material with a higher dielectric constant such as for example $Al_2O_3$, $HfO_2$ or $HfSiO_2$. However, it is also possible to deposit an electrically conductive or semiconductor material.

In this way, silicon-germanium layer 6 is deposited on protection layer 7 which is designed to separate area 4 and layer 6.

As silicon-germanium layer 6 is deposited in non-selective manner, it is deposited on first semiconducting area 2, on first masking pattern 3, on second semiconducting area 4 and on second masking pattern 3'. Silicon-germanium layer 6 forms a continuous film which continuously covers these different elements.

In a particular embodiment, deposition is performed by non-selective epitaxy. In comparison with selective epitaxy, the use of a non-selective epitaxy eliminates any problem of faceting which could cause non-covering of the foot of the gate pattern 3 which would be critical for the subsequent steps of the method. Furthermore, it is advantageous to choose deposition conditions enabling a constant thickness of material to be had on all the surfaces. When deposition by non-selective epitaxy is performed, the lattice parameter of silicon-germanium layer 6 matches the lattice parameter of the single-crystal material which forms first semiconducting area 2.

Figure 4:
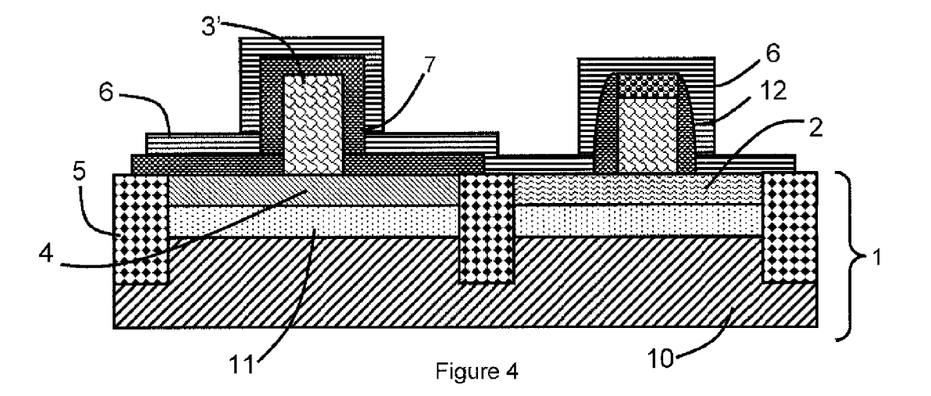
FIG. 4 represents, in schematic manner, an alternative embodiment the object whereof is to protect the lateral surfaces of the masking pattern.

As illustrated in FIG. 4, in the case where first masking pattern 3 comprises one or more layers of semiconductor material, it is advantageous to perform a specific encapsulation of first masking pattern 3 to prevent growth of silicon-germanium layer 6 from first masking pattern 3 which could prevent the formation of a continuous film or damage the gate electrode. Lateral encapsulation can be performed by spacers 12.

In a particular embodiment illustrated in FIG. 4, protection layer 7 is deposited on first semiconducting area 2, second semiconducting area 4, first masking pattern 3 and second masking pattern 3'. Area 4 and second masking pattern 3' are protected and an anisotropic etching is performed to form lateral spacers 12 from protection layer 7. This embodiment is particularly advantageous as it enables the technological steps to protect the desired elements from diffusion of the germanium atoms to be limited.

In a preferred embodiment, silicon-germanium layer 6 is deposited at very low temperature in order to reduce the thermal budget. Under these conditions, the risks of morphological modification of first semiconducting area 2 are reduced, in particular the risks of dewetting which occur, at high temperature, when the thickness of the semiconducting area is small and it becomes energetically more advantageous to form a drop of semiconductor material rather than to keep the shape of a flat film. The use of non-selective deposition enables the thermal budget to be reduced in comparison with a selective epitaxy.

As a variant, non-selective epitaxial deposition can be replaced by deposition of silicon-germanium in the form of a polycrystal or of an amorphous material. These particular depositions are performed at lower temperature and/or at higher pressure which enables the risks of dewetting to be reduced. Under these conditions, the silicon and germanium atoms do not have enough energy to continue the crystal lattice of semiconducting area 2 and the material formed is directly polycrystalline or monocrystalline and then polycrystalline. Silicon-germanium layer 6 can be at least partially deposited in polycrystalline or amorphous state on first semiconducting area 2. It can be envisaged to deposit the silicon-germanium layer by chemical vapor deposition (CVD), plasma enhanced chemical vapor deposition (PECVD) or physical vapor deposition (PVD). For example purposes, it is possible to deposit a polycrystalline or even amorphous material at a temperature less than or equal to 600° C. over a very large pressure range to have a high deposition rate. In more advantageous manner, it is possible to deposit the silicon-germanium layer at a temperature less than or equal to 300° C. which makes it possible to work with thin films that are subject to deformation if the deposition temperatures are higher, while at the same time keeping a high deposition rate.

In other words, silicon-germanium layer 6 comprises a polycrystalline phase above the open surface of first semiconducting area 2. It can also comprise an amorphous phase above the open surface of the first semiconducting area in addition to the polycrystalline phase or instead of the polycrystalline phase.

The lower the deposition temperature, the larger the proportion of amorphous phase on masking pattern 3 and if applicable on first semiconducting area 2.

The higher the deposition pressure, the larger the proportion of amorphous phase on masking pattern 3 and if applicable on area 2.

In all cases, silicon-germanium alloy 6 deposited on masking pattern 3 is polycrystalline and/or amorphous.

In a particular embodiment, the deposited thickness is about 7 nm which enables a continuous film 6 to be had under most deposition conditions whatever the materials present and their nucleation time.

Figure 5:
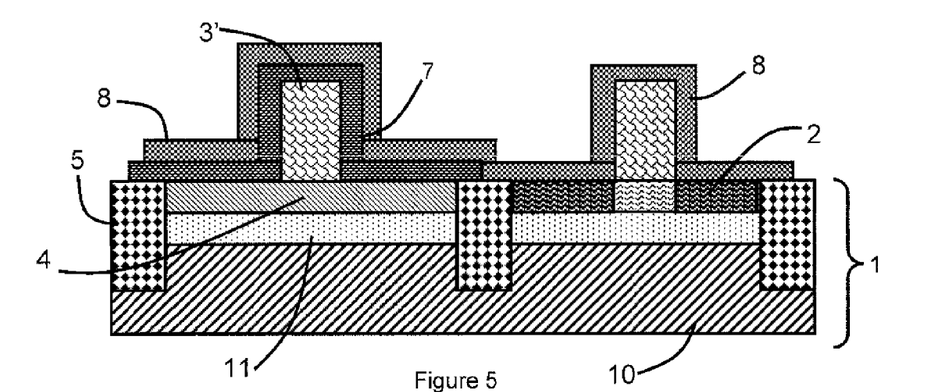

As illustrated in FIG. 5, deposition of silicon-germanium layer 6 is followed by a germanium diffusion step. Silicon-germanium layer 6 acts as germanium atom reservoir to enrich open surfaces 2a of first semiconducting area 2. Diffusion is performed by means of diffusion annealing.

In the case of a simple diffusion, silicon-germanium layer 6 is richer in germanium than first semiconducting area 2, which means that diffusion of the germanium atoms takes place from silicon-germanium layer 6 to first semiconducting area 2.

In an advantageous embodiment illustrated in FIG. 5, germanium diffusion is a condensation of the germanium which reduces the limitations of the germanium content on silicon-germanium layer 6. In a preferred embodiment, condensation of the germanium is achieved by thermal annealing which forms a silicon oxide. The progression of silicon oxide 7 pushes the germanium atoms towards semiconducting area 2 in addition to the thermal diffusion.

Figure 10:
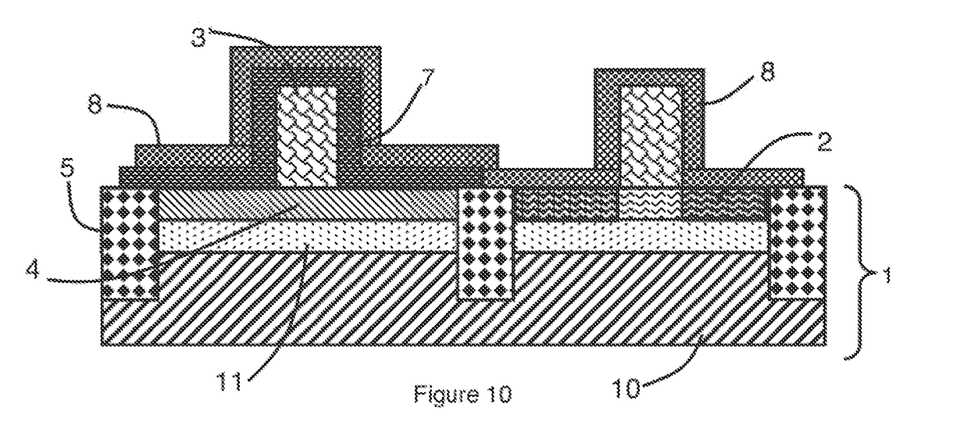
FIG. 10 represents in schematic manner an alternative embodiment wherein the area covered by the masking pattern is enriched with germanium.

The diffusion step is advantageously configured to enrich open surfaces 2a with germanium while at the same time limiting the enrichment of protected surface 2b. As a variant illustrated in FIG. 10, annealing can enable enrichment of the area situated underneath the masking pattern by increasing the thermal budget. In this configuration, it has been surprisingly observed that when diffusion of the germanium takes place, the presence of masking pattern 3 enables the surface roughness linked to the change of material to be limited.

If the substrate is used to form field effect transistors, the use of masking patterns having different lengths and/or widths enables the areas situated under the masking patterns to be differentiated according to the dimensions. For example, if the masking pattern corresponds to a gate pattern, it is possible to differentiate transistors having a small gate length and transistors having a larger gate length. The transistors having a small gate length will be able to have a conduction channel completely made from silicon-germanium alloy whereas the transistors having a longer gate length will be able to keep a conduction channel made from silicon or mainly from silicon. This configuration makes it possible to specialize short transistors for an operation of logic circuit type and long transistors for an operation of analog circuit type. This distinction can be made example while applying the same thermal budget.

Furthermore, in an alternative embodiment, it may be advantageous to modify the operating characteristics of the transistors by varying the germanium concentration in the channel which results in modulation of the threshold voltage of the transistor. This modulation is particularly advantageous for transistors of PMOS type. Under these conditions, for example for the same thermal budget, the use of masking patterns having different dimensions will result in differences in the diffusion of the germanium atoms within the future conduction channel and therefore in differences of germanium concentration.

This method makes it possible, in simple and dependable manner, to form two germanium-enriched monocrystalline areas which may be separated by an area that is poorer in germanium in self-aligned manner in area 2.

Second semiconducting area 4 and second masking pattern 3' being protected by protection layer 7, diffusion of the germanium atoms is restrained. The germanium atoms do not penetrate into second semi-conducting area 4.

In a particular embodiment, the diffusion/condensation step is preceded by deposition of a silicon oxide layer (not represented) which enables parasite diffusion or oxidation initiation phenomena to be reduced.

For example, diffusion and/or condensation can be performed by annealing at 1050° C. during one minute. The annealing can be performed in an inert atmosphere for a simple diffusion or with an oxidizing atmosphere to perform oxidation.

When diffusion/condensation takes place, the germanium atoms diffuse within first semiconducting area 2 and the thermal energy provided is sufficient for the germanium atoms to place themselves in substitutional position so as to preserve the monocrystalline nature of first semiconducting area 2. Diffusion is mainly performed in open areas 2a, i.e., the future source/drain areas, as the conduction channel is covered by masking pattern 3.

In this configuration, it is of little importance that silicon-germanium layer 6 be deposited single-crystal and/or matching the lattice parameter of semiconducting area 2 as the thermal budget applied when diffusion/condensation takes place enables the monocrystalline nature of first semiconducting area 2 to be preserved.

The use of a continuous silicon-germanium layer 6 is particularly advantageous in the case of condensation of the germanium atoms. If the film is discontinuous, oxidation can in fact be performed directly on semiconducting area 2 from the discontinuity which then forms an insulating barrier on the normal passage of the charge carriers. If the discontinuity is present in the middle of the source/drain electrodes, a part of the surface is lost which limits the performances of the device. If the discontinuity is present at the interface between the conduction channel and the source/drain electrodes, the current cannot flow in the device which becomes non-operational. The discontinuity can originate from large faceting at the edge of the masking pattern 3.

According to the embodiments, it is envisaged to oxidize the whole silicon-germanium layer 6 or only a part of silicon-germanium layer 6.

Furthermore, first masking pattern 3 covers a part of first semiconducting area 2 thereby delineating the future conduction channel of the transistor. Diffusion of the germanium atoms is performed on each side of masking pattern 3, i.e., in the future source/drain areas. As the germanium atoms are larger than the silicon atoms, there is an increase of the lattice parameter in the future source/drain areas which results in generation of a specific set of strains in the conduction channel. The applied strains have the effect of increasing the mobility of the electric charge carriers.

In advantageous manner, the shape of the masking pattern and the operating conditions for performing the diffusion annealing (simple diffusion or condensation) are configured so as to induce a uniaxial compression strain in the conduction channel which joins the source and drain areas.

Figure 6:
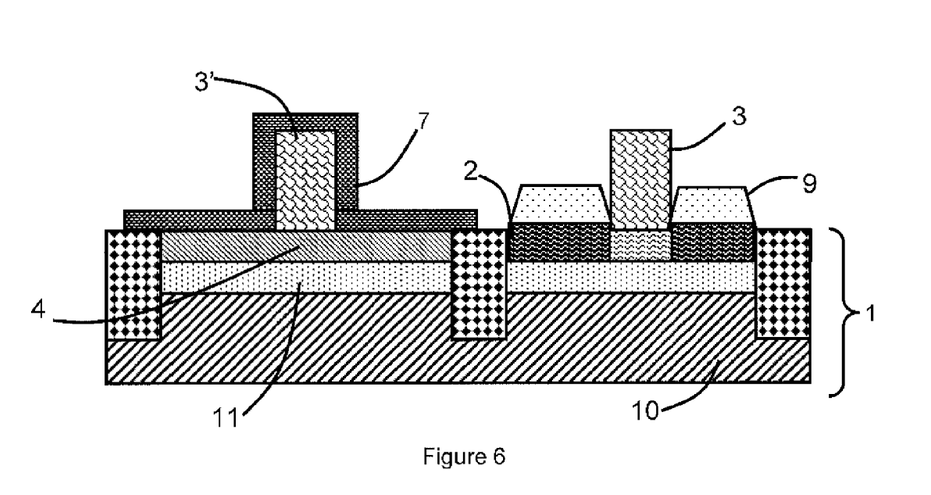

As illustrated in FIG. 6, once diffusion has been performed, the reservoir is eliminated to release the surface of semiconducting area 2 which remains monocrystalline. The addition of germanium atoms results in a thickening of semiconducting area 2. Diffusion/condensation of the germanium atoms enables semiconducting area 2 to be enriched with germanium atoms.

In the case of a simple diffusion, silicon-germanium layer 6 can be eliminated by any suitable technique, for example by means of isotropic etching which etches a predefined thickness of material. It is also possible to implant a new material in the reservoir so as to form a material that is able to be selectively eliminated with respect to the other materials present. It is further possible to perform selective removal of the amorphous and polycrystalline silicon-germanium phases with respect to the monocrystalline material by means of etching by gaseous HCl.

In the case of a condensation, the reservoir of germanium atoms is oxidized to form a film of silicon oxide 8 which can easily be eliminated. Etching of silicon oxide 8 can be performed by a hydrofluoric acid solution.

In the case where oxidation is partial, a silicon-germanium layer 6 remains above second semiconducting area 4 and the two masking patterns 3. This layer is polycrystalline and can be eliminated by any suitable technique for example by means of etching by HCl in gaseous form.

As indicated in the foregoing, first semiconducting area 2 is released by eliminating the reservoir of germanium atoms.

In an advantageous embodiment, once the surface of first semiconducting area 2 has been released, an additional semiconductor material 9 (FIG. 6) is deposited on open areas 2a, here the slightly raised source/drain areas. The deposited material is advantageously monocrystalline and has a lattice matching that of first semiconducting area 2.

Additional semiconductor material 9 can be deposited by means of selective epitaxy, for example by means of a chlorinated chemistry. Additional semiconductor material 9 can also be deposited by means of non-selective epitaxy followed by selective etching of the amorphous and polycrystalline phases with respect to the monocrystalline phase. For example, application of HCl in gaseous phase enables the amorphous or polycrystalline phase to be etched preferentially with respect to the monocrystalline phase.

Deposition of additional semiconductor material 9 enables the source/drain areas to be thickened thereby facilitating the subsequent technological steps, for example the silicidation step of the source/drain areas. Deposition of additional semiconductor material 9 is configured to be selective so as to prevent any short-circuiting between the source, drain and gate electrodes.

In the case where the diffusion annealing does not consume or does not completely consume silicon-germanium layer 6, it is advantageous to perform etching of the remaining layer 6 before depositing material 9. It is particularly advantageous to perform these two steps in the same equipment without removing the substrate to an atmosphere containing oxygen.

In a particular embodiment, substrate 1 is of semiconductor on insulator type. The substrate successively comprises a support 10, an electrically insulating film 11, and a crystalline film of semiconductor material 2. Advantageously, first semiconducting area 2 has a thickness smaller than or equal to 6 nm to make it easier to obtain a large strain. Support 1 can comprise several layers made from different materials. Electrically insulating film 11 is made from a different material from support 10.

The use of a substrate of semiconductor on insulator type is particularly advantageous as it enables the strains to be better applied in the direction of movement of the charge carriers. Buried dielectric layer 11 enables a germanium atom diffusion barrier to be formed making it easier to obtain a high germanium concentration.

In particularly advantageous manner, diffusion/condensation of the germanium atoms is configured in such a way that the whole thickness of the source/drain areas is germanium-enriched. In this case, the set of strains applies a strain only in the plane of movement of the charge carriers (uniaxial strain) which gives better results, in particular for the electron holes.

In an alternative embodiment, the substrate is a bulk substrate made from semiconductor material.

In advantageous manner, support 10 is a bulk silicon substrate which enables a support 10 to be had that is inexpensive and compatible with a very wide range of technological steps. However, depending on the applications, it is possible to envisage using another type of material.

Electrically insulating film 11 enables support 10 and the semiconductor material film forming areas 2 and 4 to be electrically insulated. Electrically insulating film 11 can be a film made from silicon oxide, silicon nitride, or a stack of these two films. It can also be envisaged to use other electrically insulating materials.

In a particular embodiment, electrical insulation between first and second semiconducting areas 2 and 4 is performed by means of an insulation pattern 5 made from electrically insulating material. For example purposes, insulation pattern 5 is made from silicon oxide. Insulation pattern 5 penetrates into the substrate to prevent the charge carriers from leaving a semiconducting area to migrate to the other semiconducting area. In advantageous manner, silicon-germanium layer 6 covers insulation pattern 5 and forms a continuous film with the part covering first and second semiconducting areas 2 and 4.

In this configuration, silicon-germanium layer 6 protects insulation pattern during the thermal annealing step and during the cleaning steps which prevents a morphological modification of the insulation pattern at high temperature, in particular thinning of the latter.

In a preferred embodiment where silicidation of the source/drain areas is used, it is advantageous to protect insulation pattern 5 in order to prevent formation of a hole which retains residues of the previous technological steps which can form an electric short-circuit between the semiconducting areas.

In an embodiment where first masking pattern 3 comprises a silicon oxide layer covered by a layer of dielectric material having a higher permittivity k, it is advantageous to protect insulation pattern 5 in order to prevent lateral etching of the silicon oxide layer inside masking pattern 3 which impairs the performances of the device. In this manner, during the condensation step, silicon oxide 8 formed on the insulation pattern enables excessive etching of insulation pattern 5 to be prevented.

In an advantageous embodiment, first semiconducting area 2 is a strained area. The crystal lattice is advantageously strained in compression for formation of a P-type field effect transistor also called PFET.

In this case, it is then possible to have a first germanium concentration in the conduction channel and a second germanium concentration in the source/drain areas. This difference of germanium concentration enables the threshold voltage of the transistor and the electrical performances to be optimized. The germanium concentration in the channel is reduced which enables the threshold voltage shift to be reduced. The germanium concentration is greater in the source/drain areas to introduce strains in the conduction channel and to improve the electrical performances.

In a particular embodiment, it is preferential to use a substrate as described in the foregoing to form one or more field effect transistors. The substrate comprises one or more areas made from silicon-germanium alloy and possibly from silicon to form the source/drain and gate electrodes. As explained in the foregoing, it is particularly advantageous to use the masking pattern to define the gate electrode, i.e. to form the final gate electrode or a false gate electrode.

Figure 11:
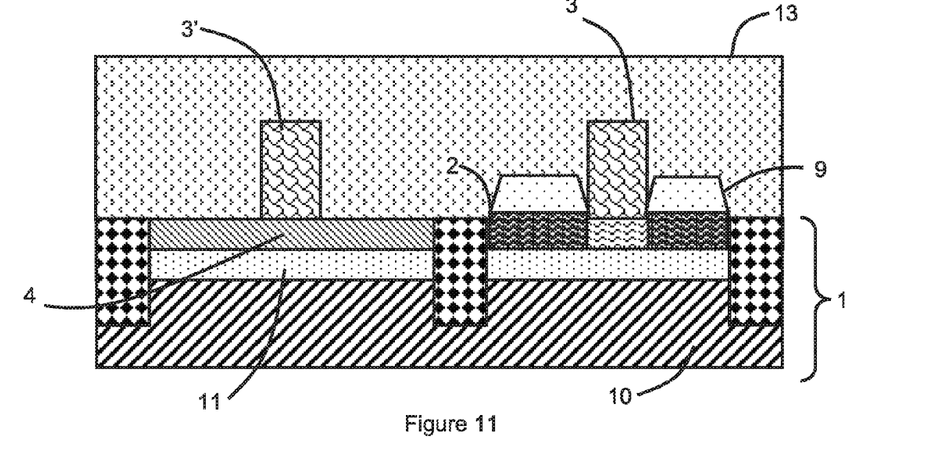

In these two cases, an electrically insulating covering layer 13 is deposited so as to cover masking pattern 3 and the source and drain areas, for example as illustrated in FIG. 11.

Figure 7:
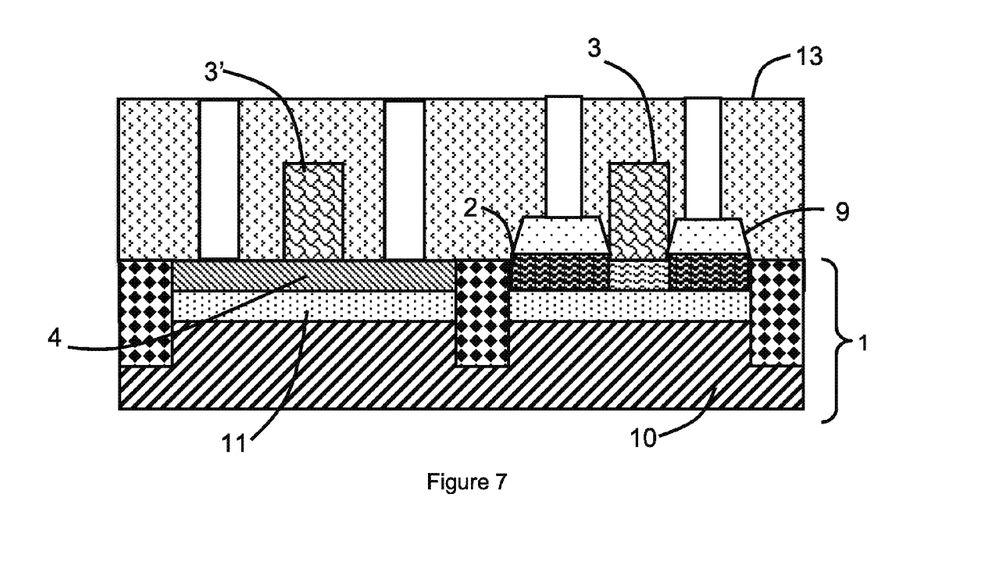
FIGS. 7, 8, 12 and 13 represent, in schematic manner, in cross-sectional view, two embodiments where the masking pattern forms the gate electrode of the transistor or delineates the position of the future gate electrode.

As illustrated in FIG. 7, the use of the masking pattern as gate electrode is particularly advantageous as it enables devices with good performances to be fabricated. There is self-alignment of the gate electrode with the source and drain areas which are germanium-enriched. The contact holes for the source, drain and gate areas are formed in covering layer 13. In this embodiment, masking pattern 3 (as a gate pattern) is formed at an early stage in the fabrication process, in particular before silicon-germanium layer 6 is deposited. The gate pattern is kept throughout the process and it is covered by covering layer 13. Covering layer 13 is then etched so as to define the source and/or drain contact holes and possibly the gate contact hole.

Figure 8:
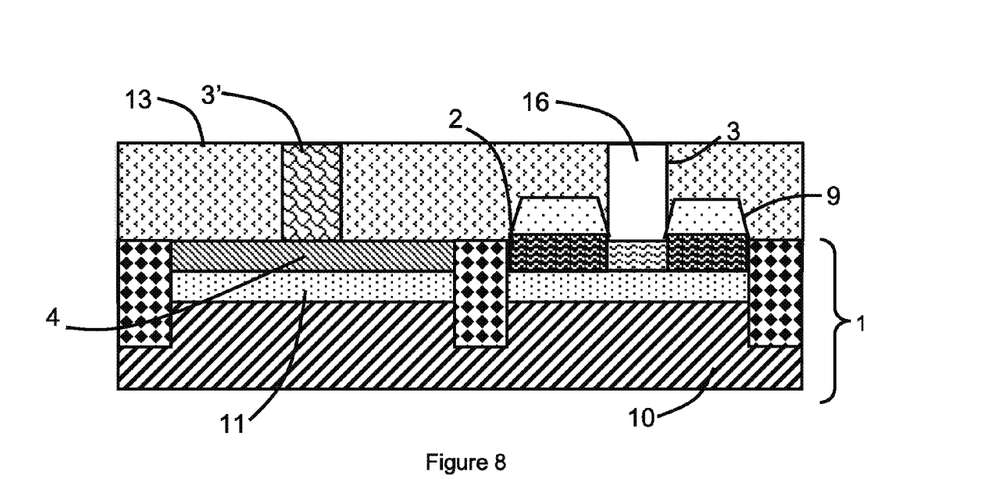
Figure 12:
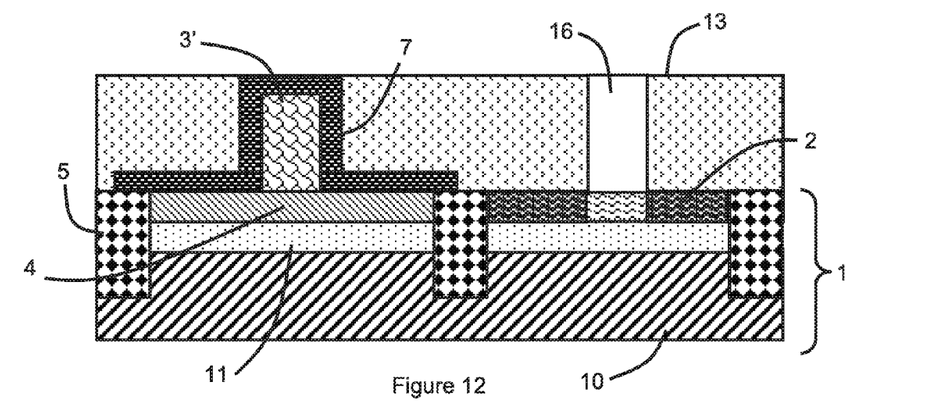
Figure 13:
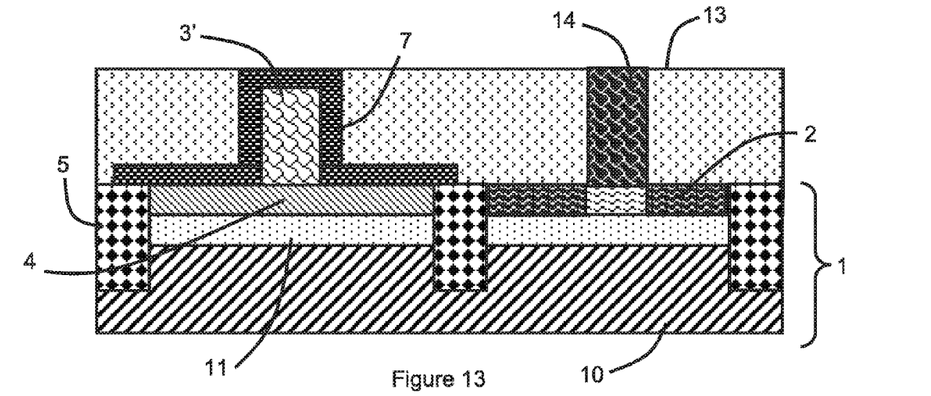

In an alternative embodiment illustrated in FIG. 8, masking pattern 3 is covered by electrically insulating covering layer 13 and an access to masking pattern 3 is made. In advantageous manner, a planarization step is performed to access the whole top surface of masking pattern 3. The masking pattern is eliminated which enables a hole (or cavity) 16 to be formed in covering layer 13. The hole formed in this way represents the former masking pattern. A new gate electrode 14 or a new gate stack is formed in the hole (or cavity) 16, for example as shown in FIGS. 12 and 13. The hole formed in covering layer 13 is self-aligned with the source and drain areas. The gate electrode is therefore self-aligned with the source and drain areas.

In advantageous manner, the thickness of masking pattern 3 is between three and ten times greater than the thickness of silicon-germanium layer 6 which enables a masking pattern which can be a gate electrode or a false gate to be achieved simply. In this case, it is possible to easily differentiate the masking pattern and the silicon-germanium layer, for example to perform a photolithography step or etching.

In advantageous manner, first semiconducting area 2 is designed for formation of a P-type field effect transistor and second semiconducting area 4 is designed for formation of an N-type field effect transistor. Second semiconducting area 4 can be strained or unstrained. Advantageously, first semiconducting area 2 is a tension-strained silicon layer.

For formation of field effect transistors, it is advantageous to use masking patterns 3 which comprise a restraining layer to form the top of the pattern. In advantageous manner, the restraining layer is made from silicon nitride.

The semiconductor material of second semiconducting area 4 is crystalline, i.e. monocrystalline or polycrystalline. In advantageous manner, semiconductor material 4 is monocrystalline in order to facilitate fabrication of repeatable field effect transistors with good performances. The semiconductor material can be made from silicon, i.e. it comprises at least 99% of silicon. However, as a variant, the semiconductor material can be made from silicon-germanium alloy. The second semiconducting area is advantageously configured to form an N-type field effect transistor (NFET).

Although the figures illustrate an embodiment with a planar architecture, the method can be used to enrich silicon or silicon-germanium films with three-dimensional architectures, for example to form a transistor of FINFET type or a suspended film.

Figure 9:
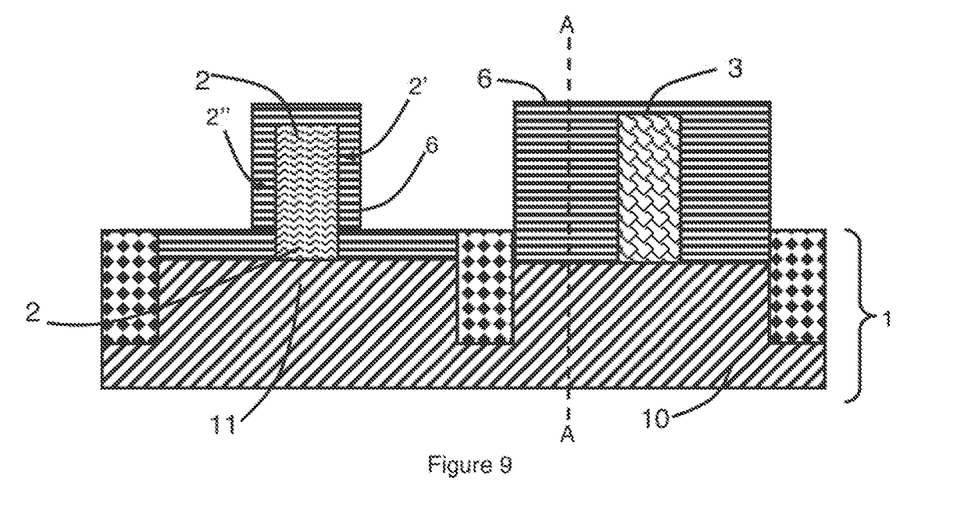
FIG. 9 represents in schematic manner another alternative embodiment concerning three-dimensional diffusion of the germanium atoms.

In a three-dimensional configuration illustrated in FIG. 9, the two main surfaces 2' and 2" of semiconductor material film 2 are covered by masking pattern 3 to define for example a conduction channel. The open areas are covered by silicon-germanium layer 6 to perform germanium enrichment. Enrichment is performed from the two opposite surfaces of the bump made from semiconductor material 2.

The thickness of film 2 corresponds to the smallest dimension of the pattern or of the layer—here the thickness is measured in a direction parallel to the main surface of support 10. In this type of configuration, the thickness is small which limits the thermal budget of the different technological steps.

The left-hand part of FIG. 9 represents a salient first semiconducting area 2 surrounded by silicon-germanium layer 6, in cross-section along the plane AA.

The right-hand part of FIG. 9 represents a side view of the same first semiconducting area 2 covered by silicon-germanium layer 6. Masking pattern 3 is illustrated for the purposes of simplifying understanding although it is normally covered by silicon-germanium layer 6.

The invention claimed is:

1. A fabrication method of a field effect transistor successively comprising:
   providing a substrate provided with a first semiconducting area partially covered by a first masking pattern to define a protected surface and an open surface,
   depositing a continuous silicon-germanium layer on the first semiconducting area and on the first masking pattern, in non-selective manner, the continuous silicon-germanium layer completely covering the first semiconducting area and the first masking pattern, so as to form an interface between the continuous silicon-germanium layer and the first semiconducting area, applying a diffusion annealing configured to make the germanium atoms diffuse from the silicon-germanium layer to the open surface of the first semiconducting area, depositing an electrically insulating layer so as to cover the masking pattern and source and drain areas, wherein the masking pattern is a gate stack of the field effect transistor or is used to define a shape of a gate stack in the electrically insulating layer so as to form said gate stack which is self-aligned with the source and drain areas and to form germanium-enriched source and drain areas when diffusion annealing is performed.

2. The method according to claim 1, wherein the silicon-germanium layer comprises a polycrystalline phase above the open surface of the first semiconducting area before applying the diffusion annealing.

3. The method according to claim 1, wherein the silicon-germanium layer comprises an amorphous phase above the open surface of the first semiconducting area before applying the diffusion annealing.

4. The method according to claim 1, wherein the diffusion annealing is a condensation annealing performed with an oxidizing atmosphere.

5. The method according to claim 1, wherein the continuous silicon-germanium layer is deposited at a temperature lower than 600° C.

6. The method according to claim 1, wherein the continuous silicon-germanium layer is deposited at a temperature lower than 300° C.

7. The method according to claim 1, wherein the substrate includes a second semiconducting area separated from the first semiconducting area by an electrically insulating insulation pattern, the continuous silicon-germanium layer covering the electrically insulation pattern.

8. The method according to claim 1, wherein the substrate comprises a second semiconducting area covered by a protection layer separating the second semiconducting area and the continuous silicon-germanium layer.

9. The method according to claim 1, wherein the first semiconducting area is made from a silicon-germanium alloy which is compression strained before applying the diffusion annealing.

10. The method according to claim 1, wherein the substrate successively comprises a support, an electrically insulating film, and the first semiconducting area.

11. The method according to claim 1, further comprising elimination of the masking pattern so as to form a cavity in the electrically insulating layer, the cavity then being filled by a gate electrode.

12. The method according to claim 1, wherein masking pattern and the diffusion annealing are configured so as to induce a uniaxial compression strain in a conduction channel connecting the germanium-enriched source and drain areas.

13. The method according to claim 1, wherein a thickness of the masking layer is between three and ten times greater than a thickness of the silicon-germanium layer.

14. The method according to claim 1, wherein the first semiconducting area is salient from the substrate and is configured to form a transistor of FinFET type.

15. The method according to claim 1, further comprising a thickening step configured for thicken the source and drain areas after applying the diffusion annealing and before depositing the electrically insulating layer.

* * * * *